(12) United States Patent
Plössl et al.

(10) Patent No.: US 11,081,620 B2
(45) Date of Patent: Aug. 3, 2021

(54) METHOD OF PRODUCING A SEMICONDUCTOR COMPONENT

(71) Applicant: OSRAM Opto Semiconductors GmbH, Regensburg (DE)

(72) Inventors: Andreas Plössl, Regensburg (DE);
Norwin von Malm, Nittendorf (DE);
Dominik Scholz, Bad Abbach (DE);
Christoph Schwarzmaier, Regensburg (DE); Martin Rudolf Behringer, Regensburg (DE); Alexander F. Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/466,658

(22) PCT Filed: Dec. 15, 2017

(86) PCT No.: PCT/EP2017/083114
§ 371 (c)(1),
(2) Date: Jun. 5, 2019

(87) PCT Pub. No.: WO2018/109193
PCT Pub. Date: Jun. 21, 2018

(65) Prior Publication Data
US 2020/0091372 A1     Mar. 19, 2020

(30) Foreign Application Priority Data
Dec. 16, 2016   (DE) .................... 10 2016 124 646.8

(51) Int. Cl.
*H01L 33/00* (2010.01)
(52) U.S. Cl.
CPC .............................. *H01L 33/0093* (2020.05)

(58) Field of Classification Search
CPC ......... H01L 21/02293; H01L 21/02631; H01L 21/02634; H01L 21/2018;
(Continued)

(56) References Cited

U.S. PATENT DOCUMENTS

| 4,074,342 A | 2/1978 | Honn et al. |
| 9,306,116 B2 | 4/2016 | El-Ghoroury et al. |

(Continued)

FOREIGN PATENT DOCUMENTS

| DE | 102 43 757 A1 | 4/2004 |
| JP | 56-17385 A | 2/1981 |

(Continued)

OTHER PUBLICATIONS

Chong, W. C. et al., "1700 Pixels Per Inch (PPI) Passive-Matrix Micro-LED Display Powered by ASIC." *IEEE Compound Semiconductor Integrated Circuit Symposium (CSICS)*. 2014. https://ieeexplore.org/documents6978524.

(Continued)

*Primary Examiner* — Walter H Swanson
(74) *Attorney, Agent, or Firm* — DLA Piper LLP (US)

(57) ABSTRACT

A method of producing a semiconductor component includes applying an auxiliary carrier at a first side of a semiconductor body, the auxiliary carrier having a first lateral coefficient of thermal expansion, and applying a connection carrier at a second side of the semiconductor body facing away from the auxiliary carrier, the connection carrier having a second lateral coefficient of thermal expansion, wherein the semiconductor body is grown on a growth substrate different from the auxiliary carrier, the first and the second lateral coefficient of thermal expansion differ by at most 50%, and the growth substrate is removed prior to application of the auxiliary carrier.

18 Claims, 11 Drawing Sheets

(58) Field of Classification Search
CPC ... H01L 21/2022–2026; H01L 21/2033–2036;
H01L 21/2085; H01L 21/2855; H01L
21/3147; H01L 21/76248; H01L
21/76262; H01L 21/76278; H01L
21/76294; H01L 21/76297; C30B
25/02–22
See application file for complete search history.

(56) References Cited

U.S. PATENT DOCUMENTS

| | | |
|---|---|---|
| 2002/0096994 A1 | 7/2002 | Iwafuchi et al. |
| 2003/0034120 A1 | 2/2003 | Yanagisawa et al. |
| 2004/0012337 A1 | 1/2004 | Oohata et al. |
| 2004/0128829 A1 | 7/2004 | Kimura |
| 2005/0042784 A1 | 2/2005 | Yanagisawa et al. |
| 2005/0233504 A1 | 10/2005 | Doi et al. |
| 2006/0240578 A1 | 10/2006 | Oohata et al. |
| 2007/0072324 A1 | 3/2007 | Krames et al. |
| 2009/0250684 A1 | 10/2009 | Ohta et al. |
| 2010/0038668 A1 | 2/2010 | Noma |
| 2011/0042772 A1 | 2/2011 | Hampp et al. |
| 2011/0136296 A1 | 6/2011 | Koo et al. |
| 2014/0034990 A1 | 1/2014 | Michel et al. |
| 2014/0084482 A1 | 3/2014 | Hu et al. |
| 2014/0147987 A1 | 5/2014 | Zhao et al. |
| 2014/0377895 A1 | 12/2014 | Seong |
| 2015/0008389 A1 | 1/2015 | Hu et al. |
| 2015/0177458 A1 | 6/2015 | Bowers et al. |
| 2017/0018682 A1 | 1/2017 | Yoo |

FOREIGN PATENT DOCUMENTS

| | | |
|---|---|---|
| JP | 2002-232021 | 8/2002 |
| JP | 2002-261335 | 9/2002 |
| JP | 2002-311858 | 10/2002 |
| JP | 2002-366054 | 12/2002 |
| JP | 2002-368282 | 12/2002 |
| JP | 2002-368288 | 12/2002 |
| JP | 2003-45901 | 2/2003 |
| JP | 2003-98977 | 4/2003 |
| JP | 2003-332523 | 11/2003 |
| JP | 2004-88083 | 3/2004 |
| JP | 2004-273596 | 9/2004 |
| JP | 2005-522875 | 7/2005 |
| JP | 2008-42143 | 2/2008 |
| JP | 2009-252836 | 10/2009 |
| JP | 2011-522436 | 7/2011 |
| JP | 2013-511853 | 4/2013 |
| JP | 2014-057035 | 3/2014 |
| JP | 2014-517518 | 7/2014 |
| KR | 10-2007-0100852 A | 10/2007 |
| KR | 10-2009-0125677 | 12/2009 |
| WO | 2008-093880 | 8/2008 |
| WO | 2016/060677 | 4/2016 |

OTHER PUBLICATIONS

Notification of Reason for Refusal dated Sep. 4, 2020, of counterpart Korean Application No. 10-2019-7019337, along with an English translation.

Decision of Refusal dated Oct. 5, 2020, of counterpart Japanese Application No. 2019-531926, along with a partial English translation.

Notice of Allowance dated Jun. 1, 2021, of counterpart Korean Application No. 10-2019-7019337, along with an English translation.

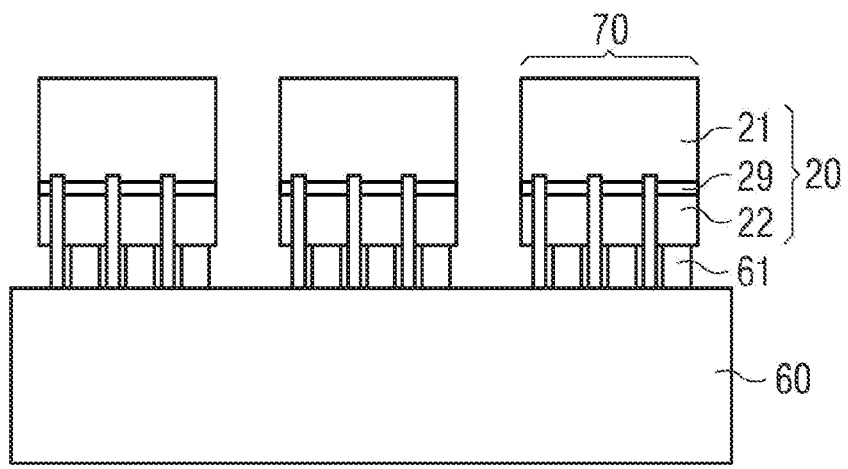
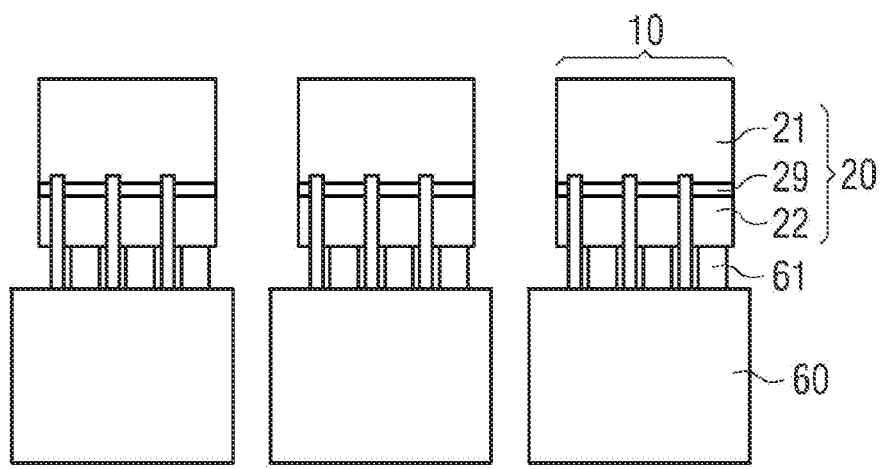

METHOD OF PRODUCING A SEMICONDUCTOR COMPONENT

TECHNICAL FIELD

This disclosure relates to a method of producing a semiconductor component.

BACKGROUND

There is a need to provide an efficient method of producing a semiconductor component.

SUMMARY

We provide a method of producing a semiconductor component, including applying an auxiliary carrier at a first side of a semiconductor body, the auxiliary carrier having a first lateral coefficient of thermal expansion, and applying a connection carrier at a second side of the semiconductor body facing away from the auxiliary carrier, the connection carrier having a second lateral coefficient of thermal expansion, wherein the semiconductor body is grown on a growth substrate different from the auxiliary carrier, the first and the second lateral coefficient of thermal expansion differ by at most 50%, and the growth substrate is removed prior to application of the auxiliary carrier.

We also provide a method of producing a semiconductor component, including applying an auxiliary carrier at a first side of a semiconductor body, the auxiliary carrier having a first lateral coefficient of thermal expansion, and applying a connection carrier at a second side of the semiconductor body facing away from the auxiliary carrier, the connection carrier having a second lateral coefficient of thermal expansion, wherein the semiconductor body is grown on a growth substrate different from the auxiliary carrier, the first and the second lateral coefficient of thermal expansion differ by at most 50%, and prior to application of the auxiliary carrier, an intermediate carrier is applied to the second side of the semiconductor body.

BRIEF DESCRIPTION OF THE DRAWINGS

FIGS. 1 to 11 describe an example of a method of producing a semiconductor component on the basis of schematic sectional views.

REFERENCE NUMERALS

Figure 1:
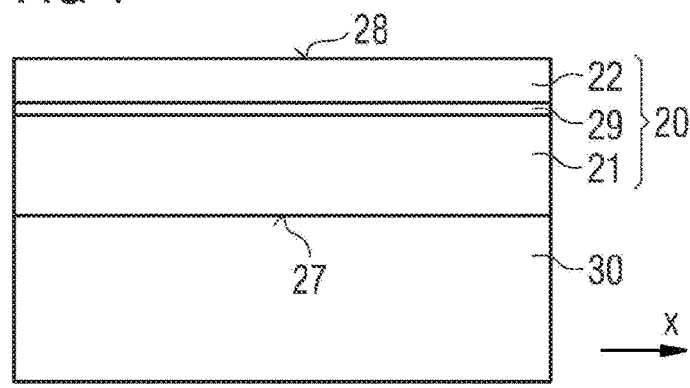

10: semiconductor component
20: semiconductor body
21: n-doped region
22: p-doped region
23: n-side contact
24: p-side contact
25: top side
26: top side
27: first side
28: second side
29: active region
30: growth substrate
40: auxiliary carrier
41: sacrificial layer
50: intermediate carrier
51: connecting layer
60: connection carrier
61: contact point
70: arrangement
x: lateral direction

DETAILED DESCRIPTION

In our method of producing a semiconductor component, the method may comprise a method step in which an auxiliary carrier is applied at a first side of a semiconductor body.

The auxiliary carrier can be a disk-shaped or a cuboid body. For example, the auxiliary carrier is a wafer. For example, the auxiliary carrier has a greater extent in a lateral direction than in a vertical direction.

The lateral directions are those directions running parallel to a main plane of extension of the auxiliary carrier. The vertical direction runs perpendicular to the lateral directions.

The auxiliary carrier has a first lateral coefficient of thermal expansion. The lateral coefficient of thermal expansion relates to the lateral directions. The lateral coefficient of thermal expansion thus describes the expansion of the auxiliary carrier for given temperature differences in the lateral directions.

The auxiliary carrier can be formed with silicon or a glass having an adapted lateral coefficient of thermal expansion. That the lateral coefficient of thermal expansion is adapted, means that the lateral coefficient of thermal expansion of the glass is, for example, similar or equal to the lateral coefficient of thermal expansion of silicon. It is also possible for the auxiliary carrier to be formed by ceramics, for example, based on aluminum nitride (AlN) or silicon nitride ($Si_3N_4$), wherein the lateral coefficient of thermal expansion is likewise adapted to the lateral coefficient of thermal expansion of silicon. The auxiliary carrier is preferably formed with silicon since this material can be easily integrated into the production process of the semiconductor component. It is possible that the auxiliary carrier is not transparent to visible light or it is possible that the auxiliary carrier is transparent and can be used for process control.

The semiconductor body can comprise different semiconductor regions. For example, the semiconductor body can comprise different semiconductor layers. Alternatively or additionally, the semiconductor body can comprise an n-doped and a p-doped region and an active region. The semiconductor body has a main plane of extension parallel to the lateral direction. The semiconductor body can be, for example, a semiconductor wafer comprising a multiplicity of electronic or optoelectronic components. The components can be, for example, diodes, transistors, integrated circuits, light-emitting diodes or lasers. It is also possible for the components to be radiation detectors, in particular those for detecting electromagnetic radiation in the infrared or in the ultraviolet spectral range.

The auxiliary carrier and the semiconductor body can be directly connected to one another without a connecting means arranged between the two components. It is also possible for a connecting material to be arranged between the auxiliary carrier and the semiconductor body. The auxiliary carrier can then be applied to the semiconductor body, for example, by adhesive bonding or soldering.

The semiconductor body is preferably heated by less than 100 K above an initial temperature during the connecting process of the semiconductor body with the auxiliary carrier. The initial temperature can be the temperature of the semiconductor body prior to application of the auxiliary carrier. The initial temperature can, for example, be 15° C. to 25° C.

The method may further comprise the step of applying a connection carrier at a second side of the semiconductor body facing away from the auxiliary carrier, the connection carrier having a second lateral coefficient of thermal expansion. The connection carrier can be, for example, control electronics on or in a silicon substrate. It is also possible for the connection carrier to have an integrated circuit or a rewiring. Since the connection carrier is applied at the second side of the semiconductor body, the semiconductor body is arranged between the connection carrier and the auxiliary carrier in the vertical direction. The connection carrier, the semiconductor body and the auxiliary carrier are thus arranged one above the other in a stacking direction running parallel to the vertical direction.

The semiconductor body may be grown on a growth substrate that is different from the auxiliary carrier. The growth substrate can be formed, for example, with sapphire, silicon, silicon carbide, gallium oxide, zinc oxide, aluminum nitride, germanium, gallium arsenide or cadmium telluride. The semiconductor body can be based on a nitride compound semiconductor such as, for example, gallium nitride, and grown on a growth substrate that is formed with sapphire. It is also possible for the semiconductor body to be formed with other compound semiconductors, in particular III-V compound semiconductors.

After the growth of the semiconductor body on the growth substrate, the growth substrate is arranged at the first side of the semiconductor body.

The first and the second lateral coefficients of thermal expansion may differ by at most 50 percent. The first and the second lateral coefficients of thermal expansion preferably differ by at most 25 percent or by at most 20 percent from one another. Particularly preferably, the first and the second lateral coefficients of thermal expansion differ by at most 10 percent or by at most 5 percent from one another.

The method may comprise a method step in which an auxiliary carrier having a first lateral coefficient of thermal expansion is applied at a first side of a semiconductor body. The method may further comprise a method step in which a connection carrier having a second lateral coefficient of thermal expansion is arranged at a second side of the semiconductor body facing away from the auxiliary carrier. In this example, the semiconductor body is grown on a growth substrate that is different from the auxiliary carrier, and the first and the second lateral coefficients of thermal expansion differ by at most 50%.

Since the auxiliary carrier and the connection carrier have a similar or the same lateral coefficient of thermal expansion, less or no thermomechanical stresses arise during the production process. In particular, during application of the connection carrier to the semiconductor body, the semiconductor component can be heated by at least 100 K above an initial temperature and subsequently cooled by at least 50 K. During this process, bending of the semiconductor component can occur if the coefficients of thermal expansion of the auxiliary carrier and the connection carrier have a too great a difference. Bending of the semiconductor component can also lead to problems in the adjustment of the semiconductor component on or in external devices. Bending of the semiconductor component and problems during the adjustment are thereby avoided by the first and the second lateral coefficients of thermal expansion being matched to one another. In addition, the further processing of the semiconductor component is made possible or facilitated if the latter is not bent. The semiconductor component can thus be efficiently produced with the aid of the method.

The growth substrate may be removed prior to application of the auxiliary carrier. The growth substrate can be removed from the semiconductor body, for example, by a laser lift-off method. It is also possible for the growth substrate to be removed by etching in aqueous solution from hydrofluoric acid and nitric acid. The growth substrate is advantageously removed from the semiconductor body as a whole and not in pieces so that no edge effects occur. In addition, the growth substrate is removed prior to application of the connection carrier so that the connection carrier cannot be damaged during the detachment of the growth substrate.

Between the auxiliary carrier and the semiconductor body a sacrificial layer may be arranged which is not produced epitaxially. The sacrificial layer is thus arranged at the first side of the semiconductor body. In this way, it is possible in a particularly simple manner, to apply the sacrificial layer at the first side of the semiconductor body only after the semiconductor body has been grown.

The semiconductor body can be grown epitaxially on the growth substrate, which can be removed prior to application of the sacrificial layer. The sacrificial layer can connect the auxiliary carrier to the semiconductor body. The sacrificial layer can be formed by a thermally stable metal oxide such as, for example, zinc oxide. Furthermore, it is possible for the sacrificial layer to contain or consist of aluminum. It is also possible for a connecting means to be arranged between the semiconductor body and the auxiliary carrier in addition to the sacrificial layer, where the auxiliary carrier and the semiconductor body are connected to one another via the connecting means. The connecting means can in particular be an adhesive or a solder material.

The sacrificial layer may be removed from the semiconductor body after the connection carrier has been applied. The auxiliary carrier can be porous or have holes to accelerate the release or swelling of the sacrificial layer during the removal of the sacrificial layer. As a result, the sacrificial layer can be removed particularly gently from the semiconductor body and selectively to other materials. This means that only the sacrificial layer is removed and no other materials, in particular, the connection carrier is not damaged during detachment of the sacrificial layer.

The sacrificial layer may be removed from the semiconductor body by wet-chemical etching. The sacrificial layer can be formed with an amorphous material. For example, the sacrificial layer can be formed by porous silicon or spin-on-glass materials. This makes it easier to release or remove the sacrificial layer.

The semiconductor body may be heated at least in places by at least 100 K from an initial temperature during application of the connection carrier and is subsequently cooled by at least 50 K. For example, the connection carrier and the semiconductor body can be connected to one another by a metallic solder material. To connect the connection carrier to the semiconductor body, the semiconductor component can be heated at least in places by at least 100 K and the ambient pressure can be increased. It is also possible to liquefy the solder material between the semiconductor body and the connection carrier to connect the connection carrier and the semiconductor body. Subsequently, the semiconductor component is cooled by at least 50 K and the pressure is optionally reduced again. The auxiliary carrier and the connection carrier advantageously have lateral coefficients of thermal expansion that differ by at most 50%. Thus, no or only a few thermomechanical stresses arise in the semiconductor body with the connection carrier during the cooling process.

The semiconductor body may be designed to emit electromagnetic radiation during operation of the semiconductor component. For this purpose, the semiconductor body can comprise an active region that emits electromagnetic radiation during operation of the semiconductor component. The semiconductor component can be, for example, a light-emitting diode or a laser. It is also possible for the semiconductor body to detect electromagnetic radiation during operation of the semiconductor component.

The semiconductor body and the auxiliary carrier may be separated transversely or perpendicularly to a main direction of extension of the auxiliary carrier into a plurality of arrangements, each comprising a part of the semiconductor body and a part of the auxiliary carrier, before the connection carrier is applied to the semiconductor body. This means that the semiconductor body and the auxiliary carrier are singulated into individual parts. To separate the semiconductor body and the auxiliary carrier, the semiconductor body and the auxiliary carrier are applied to a frame, for example, to hold the individual arrangements together. This means that the semiconductor body and the auxiliary carrier are completely separated in the vertical direction or transversely to the main direction of extension direction of the auxiliary carrier and are connected to one another only by the frame. Thus, separating trenches are formed between the individual arrangements.

The plurality of arrangements can already be tested prior to application of the connection carrier. If the semiconductor component is a light-emitting diode, a plurality of light-emitting diodes can thus be tested or characterized prior to application of the connection carrier, and defective light-emitting diodes can be sorted out after the separation. It is also possible for the arrangements to be sorted according to certain criteria, for example, emission wavelengths.

In an example, the auxiliary carrier can be porous or have holes. In the regions of the auxiliary carrier, which are not separated, in which there is thus no separating trench, the diameter of the holes is substantially smaller than the width of the separating trenches, for example less than 20% of the width of the separating trenches. For example, the diameter of the holes in these regions can be at most 20 µm. In the regions in which the separating trenches are located between the plurality of arrangements, the holes in the auxiliary carrier can be of a similar size as the width of the separating trenches. For example, the holes in the auxiliary carrier can have a diameter of 80 to 90% of the width of the separating trenches in the regions of the separating trenches. This can mean, for example, that, with a width of the separating trenches of 120 µm, the holes in the auxiliary carrier can have a diameter of 105 µm in the regions of the separating trenches.

In an example, the plurality of arrangements can be applied to a plurality of connection carriers. This means that a connection carrier having a similar lateral extent to the arrangement is applied to each of the arrangements.

In an example, the arrangements have a length and a width in lateral directions. In this example, it is possible for the ratio of length to width of the arrangements to be different from 1. This means that the arrangements can have the shape of a rectangle, for example.

The growth substrate need not be formed with silicon. The growth substrate is preferably formed with sapphire, silicon carbide, germanium or gallium arsenide. A semiconductor body, which is based on a nitride compound semiconductor such as, for example, gallium nitride can be grown on the materials with a better quality than on silicon.

The semiconductor body may comprise an n-doped region and a p-doped region, and the connection carrier is applied to the semiconductor body at the side of the p-doped region. The n-doped region is doped with at least one n-dopant. The n-doped region can comprise one or more n-doped semiconductor layers. The p-doped region is doped with at least one p-type dopant. The p-doped region can comprise one or more p-doped semiconductor layers. The n-doped region and the p-doped region are arranged one above the other in the vertical direction.

The n-doped region can be located at the first side of the semiconductor body and the p-doped region can be located at the second side of the semiconductor body. The n-doped region can thus be grown before the p-doped region on the growth substrate. The connection carrier can be applied to the p-doped region. Between the n-doped region and the p-doped region an active region can be arranged in which, for example, electromagnetic radiation is generated during operation. In this example, a reflective layer can advantageously be arranged between the active region and the connection carrier such that electromagnetic radiation emitted in the semiconductor body during operation of the semiconductor component is reflected at the reflective layer and can leave the semiconductor body at the first side.

The connection carrier may comprise an integrated circuit. For example, the connection carrier can comprise control electronics on or in a silicon substrate. The semiconductor body can be controlled or read by the integrated circuit. It is also possible for the connection carrier to have a rewiring.

The connection carrier may comprise a plurality of contact points on its outer surface facing the semiconductor body, where the contact points mechanically and electrically conductively connect to the semiconductor body. The connection carrier can therefore comprise contact points connected to n-side and p-side contacts of the semiconductor body. An active region of the semiconductor body can thus electrically conductively connect to the connection carrier. It is also possible for individual arrangements, for example, individual light-emitting diodes of the semiconductor body to be controlled separately.

An intermediate carrier may be applied at the second side of the semiconductor body before the auxiliary carrier is applied. The intermediate carrier can, for example, be applied to the second side of the semiconductor body before the growth substrate is removed from the semiconductor body. The lateral coefficient of thermal expansion of the intermediate carrier can differ by more than 50% from the lateral coefficient of thermal expansion of the connection carrier or the auxiliary carrier. It is also possible for the intermediate carrier to be formed by sapphire, silicon or a glass having a coefficient of thermal expansion similar to that of silicon. A connecting layer can be arranged between the intermediate carrier and the semiconductor body. Advantageously, the connecting layer can be applied at temperatures similar to an initial temperature of the semiconductor body and the connecting layer can be removed again. The intermediate carrier can be connected to the semiconductor body by, for example, pressing or melting a metallic layer under an elevated ambient pressure. The metallic layer is the connecting layer in this example After the intermediate carrier has been applied, the growth substrate can be removed from the semiconductor body so that the auxiliary carrier can be applied at the first side of the semiconductor body.

The semiconductor body may be grown in an inverted manner so that the p-doped region is grown on the growth substrate before the n-doped region. In this example, no intermediate carrier is required.

The semiconductor body may be polished at the first side of the semiconductor body prior to application of the auxiliary carrier. It is also possible for the semiconductor body to be roughened at the first side. This can serve for better outcoupling of electromagnetic radiation from the semiconductor body.

Electrical contacts via which different regions of the semiconductor body can be electrically contacted can be applied at the second side of the semiconductor body. If the semiconductor body comprises, for example, an n-doped region and a p-doped region, an n-side contact and a p-side contact can be applied at the second side. It is also possible to provide a plurality of n-side and p-side contacts at the second side of the semiconductor body. In this example, it is possible for the various electrical contacts to be electrically insulated from one another.

It is thus possible to process the first and the second side of the semiconductor body before the connection carrier is applied to the semiconductor body. The connection carrier is thus not damaged by processing at the first and the second side of the semiconductor body. In addition, the arrangements can be tested and individual arrangements can be sorted out according to certain criteria before further processing. It is also possible for the semiconductor component to be processed to such an extent before application of the connection carrier, that the further processing of the semiconductor component with the connection carrier is simplified. The costs of the method of producing a semiconductor component can therefore be reduced and the semiconductor component can be produced efficiently.

The auxiliary carrier and the connection carrier may consist of at least 80 percent by weight of the same basic material. The basic material thus forms at least 80 percent by weight of the auxiliary carrier and the connection carrier. Since the auxiliary carrier and the connection carrier consist of at least 80 percent by weight of the same basic material, the auxiliary carrier and the connection carrier have similar or identical coefficients of thermal expansion. Therefore, fewer or no thermomechanical stresses occur during the method of producing the semiconductor component. Since the semiconductor component is thus not bent by thermomechanical stresses, no problems occur during adjustment of the semiconductor component, and thus the latter can be produced more efficiently. The base material is in particular silicon.

The growth substrate may be arranged at the second side of the semiconductor body during the growth of the semiconductor body. This means that no intermediate carrier is necessary to apply the auxiliary carrier to the first side of the semiconductor body and to apply the connection carrier to the second side of the semiconductor body. The method thus comprises fewer method steps in total.

Our method of producing a semiconductor component in conjunction with examples and the associated figures is explained in more detail below.

Identical, similar or identically acting elements are provided with the same reference symbols in the figures. The figures and the size ratios of the elements illustrated in the figures among one another are not to be regarded as being to scale. Rather, individual elements can be represented with an exaggerated size for better representability and/or for better intelligibility.

FIG. 1 shows a schematic cross section through a semiconductor body 20 on a growth substrate 30, wherein the semiconductor body comprises a first side 27 and a second side 28, which faces away from the first side 27. The semiconductor body 20 comprises an n-doped region 21, a p-doped region 22 and an active region 29. The n-doped region 21 is grown on the growth substrate 30. The growth substrate 30 is thus located at the first side 27 of the semiconductor body 20. The active region 29 is grown on the n-doped region 21 and the p-doped region 22 is grown on the active region 29. The p-doped region 22 is thus located at the second side 28 of the semiconductor body 20. The active region 29 emits electromagnetic radiation during operation of the semiconductor body 20.

The semiconductor body 20 extends in lateral directions x that are parallel to the main direction of extension of the semiconductor body 20, over the entire region of the growth substrate 30. The growth substrate 30 can be formed with sapphire, silicon carbide, germanium or gallium arsenide. Advantageously, the semiconductor body 20 is not grown on a silicon substrate. The semiconductor body is preferably based on a nitride compound semiconductor such as, for example, gallium nitride, and the growth substrate 30 is preferably formed with sapphire.

Figure 2:
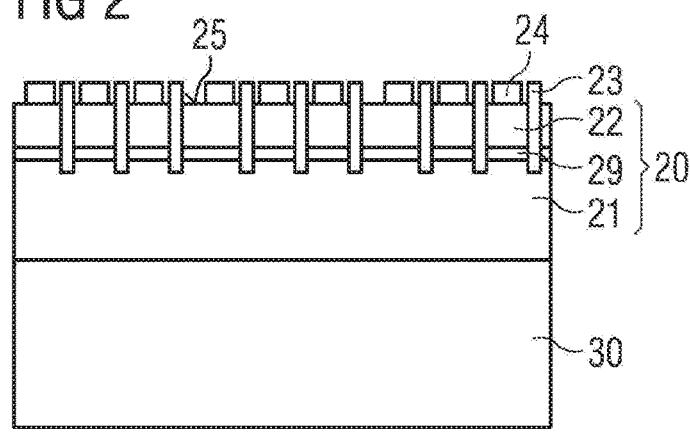

FIG. 2 shows a next step of the example of the method of producing a semiconductor component 10. In this step, n-side contacts 23 and p-side contacts 24 are applied to the p-doped region 22. In this example, the n-side contacts 23 extend from a top side 25 of the p-doped region 22, where the top side 25 faces away from the growth substrate 30, in the direction of the growth substrate 30 through the active region 29 into the n-doped region 21. The n-side contacts 23 can be formed by a cut-out through the p-doped region 22 and a part of the n-doped region 21. The cut-out is electrically insulated from the p-doped region and filled with an electrically conductive material. The p-side contacts 24 are applied to the top side 25 of the p-doped region 22. The n-side contacts 23 and the p-side contacts 24 are electrically insulated from one another on the top side 25 of the p-doped region 22.

Figure 3:
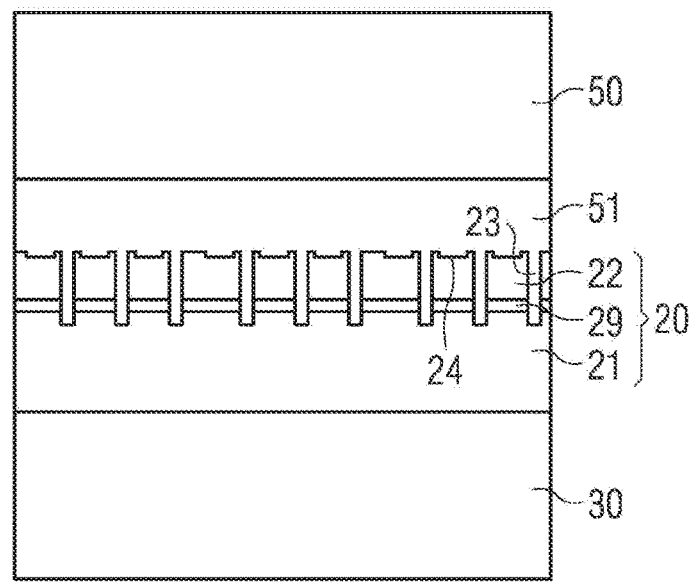

FIG. 3 shows that, in the next step of the method, an intermediate carrier 50 is applied to the semiconductor body 20 at the side of the p-doped region 22. The semiconductor body 20 and the intermediate carrier 50 connect to one another by a connecting layer 51. In this example, the connecting layer 51 is arranged between the intermediate carrier 50 and the semiconductor body 20. During the connecting process of the intermediate carrier 50 and the semiconductor body 20 with the connecting layer 51, the semiconductor body 20 is heated by less than 100 K above an initial temperature. The connecting layer 51 can be formed, for example, with benzocyclobutene (BCB) or with gallium selenide.

It is possible for the intermediate carrier 50 and the semiconductor body 20 to connect to one another, in that the semiconductor body 20 is heated by less than 100 K above an initial temperature, and the intermediate carrier 50 and the semiconductor body 20 are pressed together in the meantime. It is also possible for the connecting layer 51 to be formed by a metal and that during the connecting process, the ambient pressure is increased relative to an initial ambient pressure.

Figure 4:
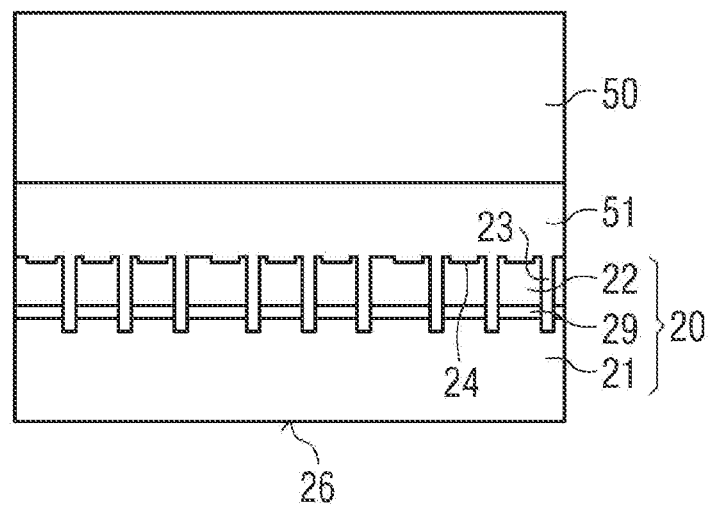

In the next step of the method as shown in FIG. 4, the growth substrate 30 is removed from the semiconductor body 20. The growth substrate 30 can be removed, for example, by a laser lift-off method if the growth substrate 30 is formed with sapphire. If the growth substrate 30 is formed with silicon, the latter can be removed from the semiconductor body 20 by etching in an aqueous solution of hydrofluoric acid and nitric acid. If the growth substrate 30 is formed with gallium arsenide, the latter can be removed from the semiconductor body 20 by etching in an aqueous solution of sulphuric acid and hydrogen peroxide. In this example, it is advantageous for the growth substrate 30 to be detached from the semiconductor body 20 over the whole area and not in separated parts, since no edge effects thus occur.

In addition, in this step of the method, a top side 26 of the n-doped region 21 can be processed, where the top side 26 is located at the side of the n-doped region 21 facing away from the intermediate carrier 50. For example, the top side 26 of the n-doped region 21 can be polished or roughened or it is possible, that a mechanical protection is applied. Advantageously, in this example of the method of producing a semiconductor component 10, both the top side 26 of the n-doped region 21 and the top side 25 of the p-doped region 22 can be processed, without a connection carrier 60, which is applied in a later step of the method, being damaged.

Figure 5:
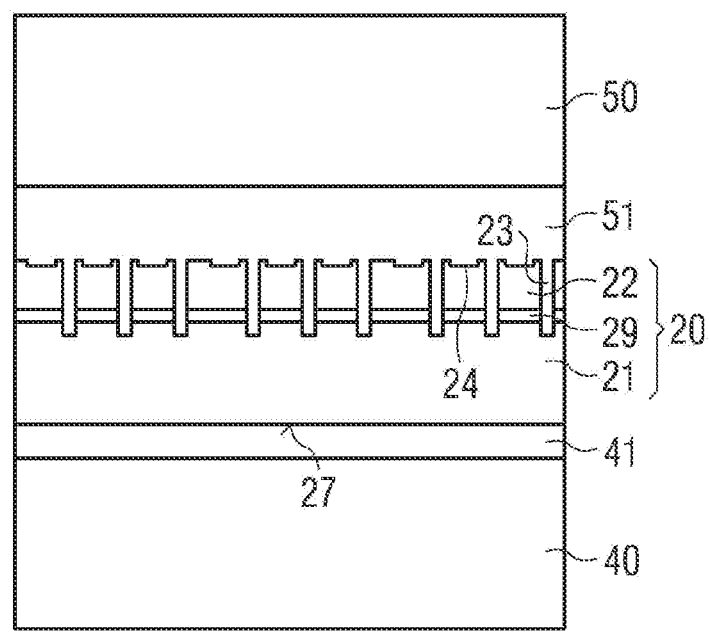

FIG. 5 shows that, in the next step of the method, an auxiliary carrier 40 is applied to the semiconductor body 20 at the side of the n-doped region 21, that is to say at the first side 27. The auxiliary carrier 40 extends over the entire lateral extent of the semiconductor body 20. The auxiliary carrier 40 can be formed by silicon or a glass having a coefficient of thermal expansion, which is similar to that of silicon. It is also possible for the auxiliary carrier 40 to be formed by ceramics, for example, on the basis of aluminum nitride or silicon nitride.

To apply the auxiliary carrier 40, a sacrificial layer 41 is applied to the semiconductor body 20 at the first side 27 of the semiconductor body 20. It is also possible that the sacrificial layer 41 is applied to the auxiliary carrier 40 or an adhesive layer is applied in addition to the sacrificial layer 41. The sacrificial layer 41 can be formed, for example, by a thermally stable metal oxide such as zinc oxide or aluminum. It is also possible for the sacrificial layer 41 to be formed by porous layers such as, for example, porous silicon or spin-on-glass materials. The auxiliary carrier 40 can be applied to the semiconductor body 20 using similar processes as for the intermediate carrier 50. This means that during the connection of the auxiliary carrier 40 to the semiconductor body 20 the temperature of the semiconductor body 20 is increased by less than 100 K relative to an initial temperature. It is also possible for the semiconductor body 20 and the auxiliary carrier 40 to be adhesively bonded to one another by an adhesive layer.

Figure 6:
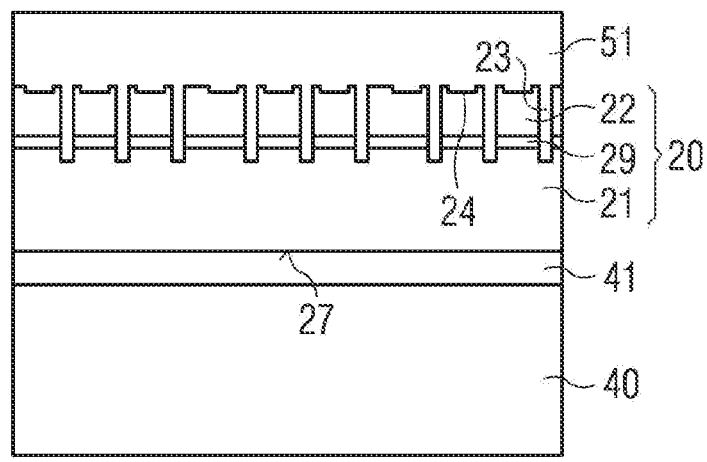

FIG. 6 shows that, in the next step of the method, the intermediate carrier 50 is removed from the semiconductor body 20. The intermediate carrier 50 can be removed, for example, by a laser lift-off process. If the intermediate carrier 50 is formed by silicon, it is also possible that the intermediate carrier 50 is ground thinner before the removal and is then etched wet-chemically or in the gas phase. In this example, the connecting layer 51 remains on the semiconductor body 20. But it is also possible that the connecting layer is likewise removed.

Figure 7:
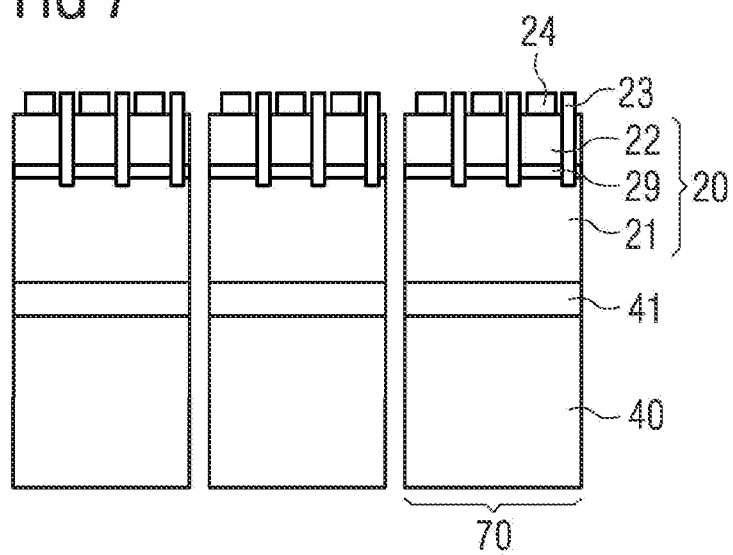

FIG. 7 shows that, according to an optional method step, the semiconductor body 20 is singulated on the auxiliary carrier 40. This means that the semiconductor body 20 and the auxiliary carrier 40 are separated into a plurality of arrangements 70 perpendicularly to a main direction of extension of the auxiliary carrier 40. In this example, each of the arrangements 70 comprises a part of the semiconductor body 20 and a part of the auxiliary carrier 40. The singulated arrangements 70 can in this case be arranged on a frame, which is not shown.

Figure 8:
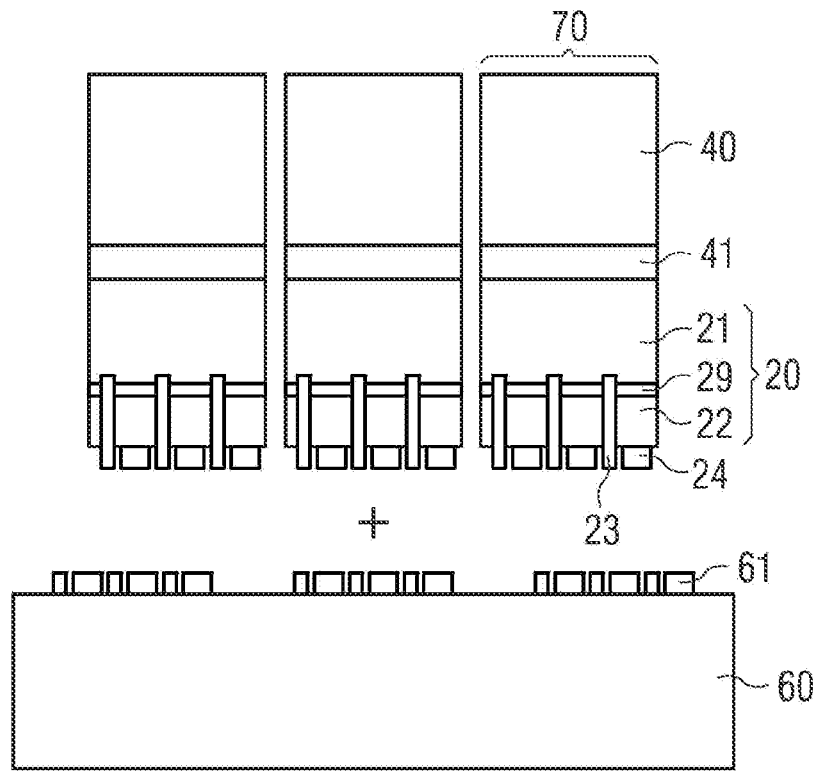

FIG. 8 shows that in the next step of the method of producing a semiconductor component 10, a connection carrier 60 is provided. The connection carrier 60 can comprise, for example, control electronics on a silicon substrate or a so-called complementary metal oxide semiconductor structure. Electrical contact points 61 are applied to the connection carrier 60. The contact points 61 are electrically insulated from one another. The connection carrier 60 consists of at least 80 percent by weight of a base material, which is formed with silicon. The auxiliary carrier 40 has a first lateral coefficient of thermal expansion and the connection carrier 60 has a second lateral coefficient of thermal expansion, wherein the first and the second lateral coefficients of thermal expansion differ by at most 50%. The auxiliary carrier 40 and the connection carrier 60 preferably comprise the same basic material, and the first and the second lateral coefficient of thermal expansion are preferably identical.

Before the connection carrier 60 is applied to the semiconductor body 20, the individual arrangements 70, if already present, can be tested. For example, the individual arrangements 70 can be individual light-emitting diodes. Thus, possibly defective arrangements 70 can be sorted out before being applied to the connection carrier 60. In addition, it is advantageous that the connection carrier 60 is applied to the semiconductor body 20 only after the growth substrate 30 has been removed, since damage to the connection carrier 60 is thus prevented during the removal of the growth substrate 30.

Figure 9:
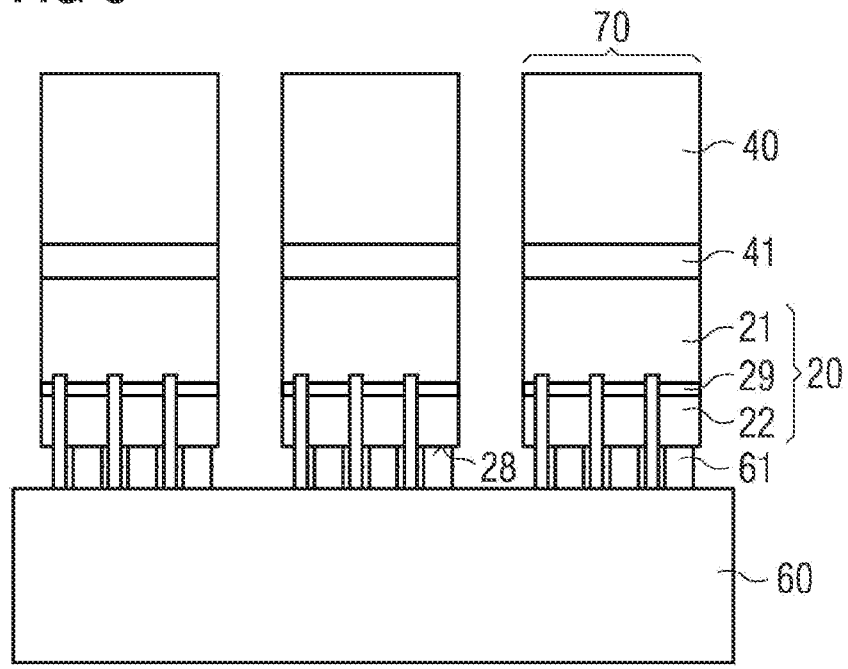

As shown in FIG. 9, in the next step of the method, the connection carrier 60 is applied to the semiconductor body 20 at the second side 28. This means that the n-side contacts 23 and the p-side contacts 24 of the semiconductor body 20 electrically and mechanically connect to the contact points 61 of the connection carrier 60. In this example, the semiconductor body 20 can be heated by at least 100 K above an initial temperature and subsequently cooled by at least 50 K. It is also possible for the ambient pressure to be increased during the connection process. It is also possible that the contact points 61 and/or the n-side contacts 23 and the p-side contacts 24 are melted or the latter are connected to one another by a metallic solder material. Since the auxiliary carrier 40 and the connection carrier 60 have a similar or the same lateral coefficient of thermal expansion, a few or no thermomechanical stresses occur during the connection process. Bending of the arrangements 70 is thus avoided. As a result, further processing of the arrangements 70 is made possible or facilitated.

In the next step of the method as shown in FIG. 10, the auxiliary carrier 40 is removed from the semiconductor body 20. In this example, the sacrificial layer 41 is removed by a gentle method. For example, the sacrificial layer 41 can be removed by wet-chemical etching. In this example, the connection carrier 60 is not damaged. It is also possible for the auxiliary carrier 40 to be porous or to have holes to accelerate the release or swelling of the sacrificial layer 41.

Since the auxiliary carrier 40 is applied to the semiconductor body 20 by the sacrificial layer 41, the sacrificial layer 41 can be selectively removed and the auxiliary carrier 40 can thus be removed. This step is not possible if the semiconductor body 20 is grown on a silicon substrate. In this example, the silicon substrate could only be chemically selectively removed with protective measures for the connection carrier 60. In addition, it would be substantially more complex to implement this step for individual arrangements 70 for which reason a sorting out of defective arrangements 70 would not be possible.

FIG. 11 shows that the individual arrangements 70 are singulated on the connection carrier 60. This means that the connection carrier 60 is separated perpendicularly to a main direction of extension of the connection carrier 60. The connection carrier 60 can be separated, for example, by a sawing process, laser separation or plasma etching. In this example, the connection carrier 60 is separated along the arrangements 70. If the semiconductor body 20 has not yet been divided into individual arrangements 70, in this method step, the semiconductor body 20 is separated into individual arrangements 70 and the connection carrier 60 is separated. Subsequently, each of the arrangements 70 with the associated part of the connection carrier 60 forms a semiconductor component 10. In this example, it is also possible that two or more arrangements 70 are assigned to each part of the connection carrier 60. It is also possible for arrangements 70 to be applied to a plurality of connection carriers 60.

The method can thus be used to produce a multiplicity of semiconductor components 10. If the individual semiconductor components 10 are light-emitting diodes, the emission side of the light-emitting diodes is formed by the top side 26 of the n-doped region 21. The top side 26 of the n-doped region 21 or the emission side of the light-emitting diodes can be processed before application of the connection carrier 60. The further process control of the semiconductor component 10 is thus simplified and more efficient.

Figure 12:
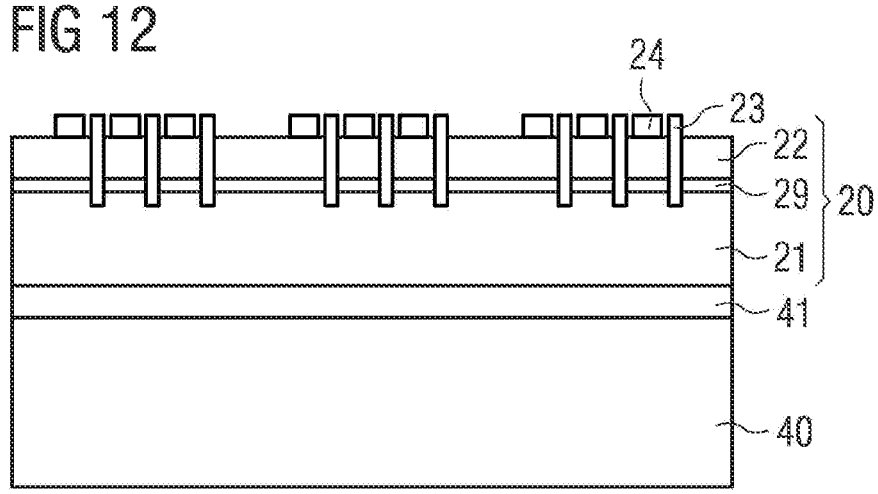
FIGS. 12 to 15 show steps of a further example of the method.

The further example of the method shown in FIGS. 12 to 15 comprises the method steps that are shown in FIGS. 1 to 5. The subsequently following method step is shown in FIG. 12. The intermediate carrier 50 is removed from the semiconductor body 20, for example, by a laser lift-off process. The connecting layer 51 is likewise removed from the semiconductor body 20. The n-side contacts 23 and the p-side contacts 24 can thus be electrically contacted.

Figure 13:
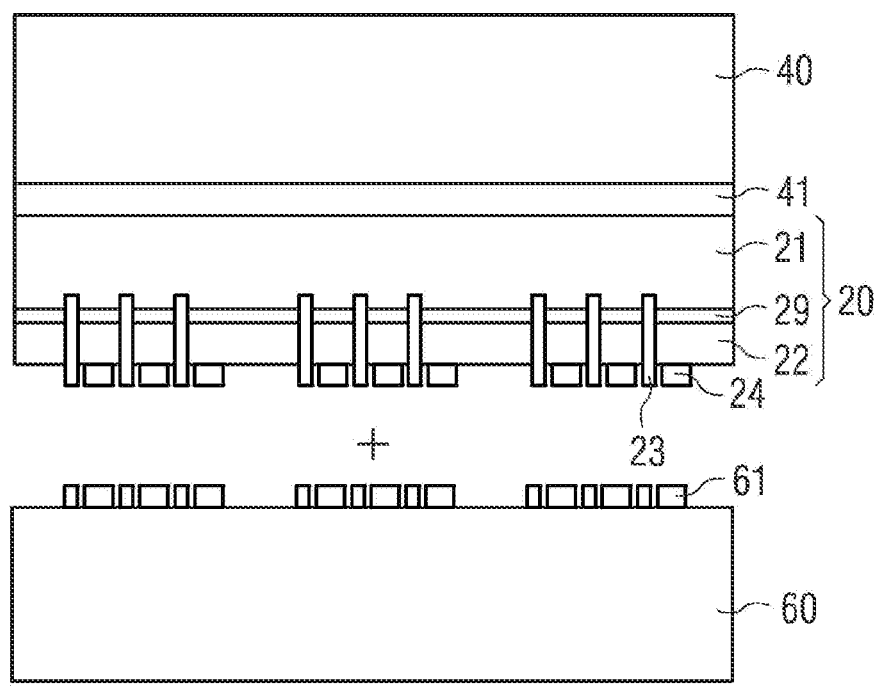

FIG. 13 shows that the connection carrier 60 is provided in the next step of the method. In this example, the semiconductor body 20 is not yet singulated on the auxiliary carrier 40. Edge effects can thus advantageously be avoided.

Figure 14:
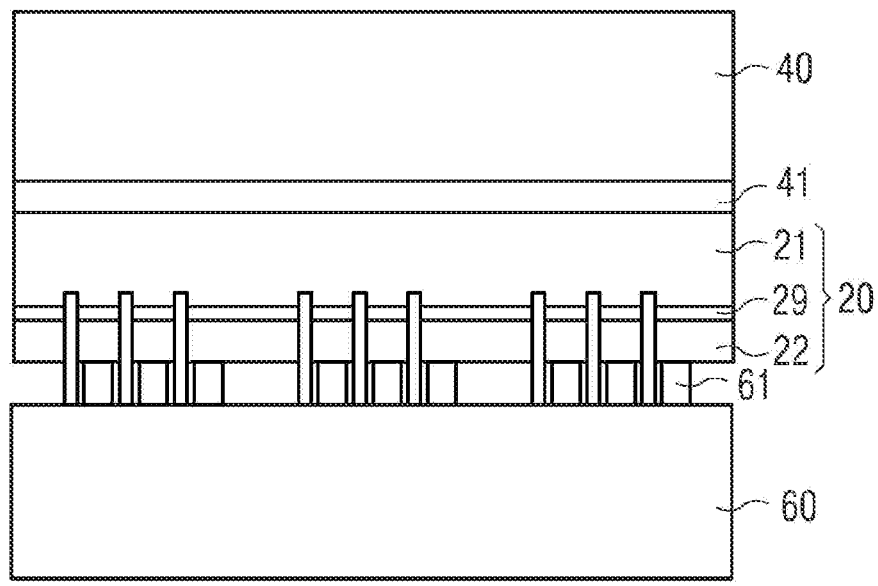

In the next step of the method as shown in FIG. 14, the connection carrier 60 is applied to the semiconductor body 20 at the second side 28. As described in connection with FIG. 9, the n-side contacts 23 and the p-side contacts 24 electrically and mechanically connect to the contact points 61 of the connection carrier 60.

Figure 15:
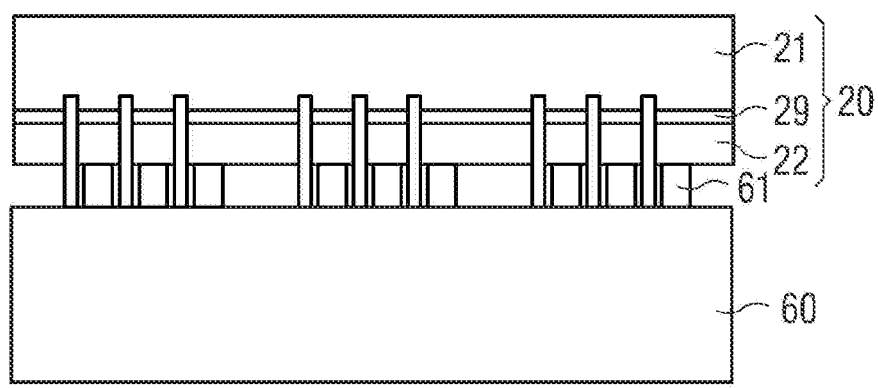

As shown in FIG. 15, the auxiliary carrier 40 is removed from the semiconductor body 20 in the next step of the method. In this example, the sacrificial layer can be removed by wet-chemical etching. In contrast to the method step shown in FIG. 10, the semiconductor body 20 is not yet singulated in this example. In the next step of the method, the semiconductor body 20 is singulated on the connection carrier 60. The further steps of the method according to the further example are described in connection with FIGS. 10 and 11.

Figure 16:
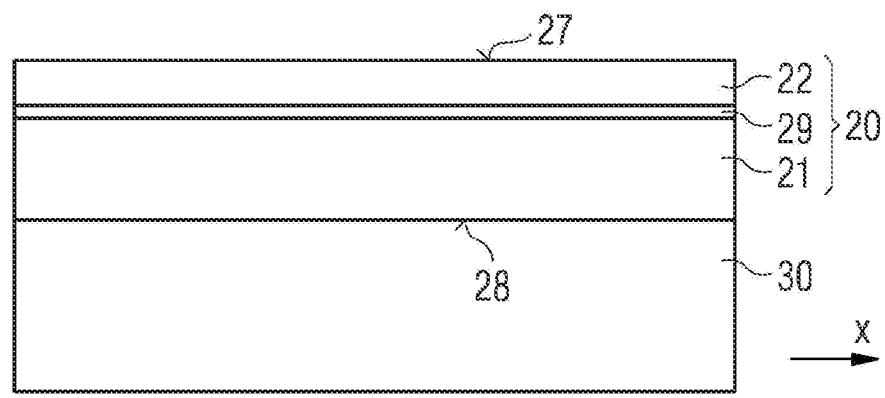
FIGS. 16 to 17 show steps of a further example of the method.

FIG. 16 shows a step of a further example of the method. In this example, the growth substrate 30 is arranged at the second side 28 of the semiconductor body 20. As described in connection with FIG. 1, the n-doped region 21 is grown on the growth substrate 30.

Figure 17:
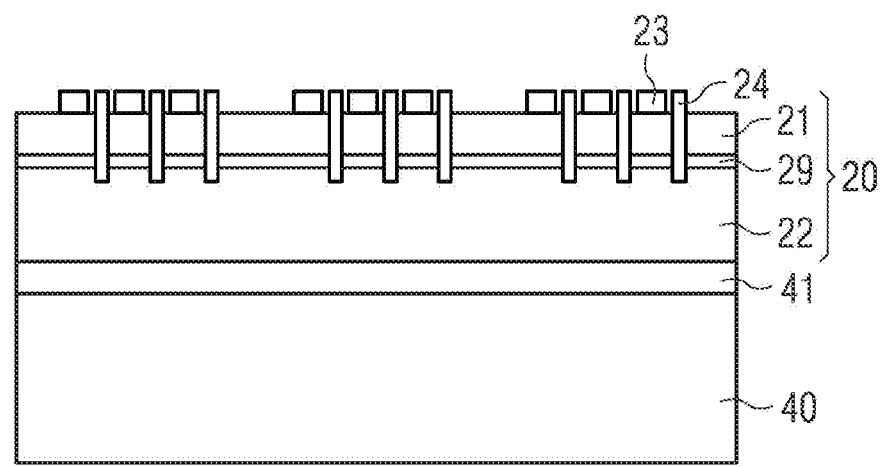

FIG. 17 shows that in further steps of the method an auxiliary carrier 40 is applied at the first side 27 of the semiconductor body 20. The auxiliary carrier 40 connects to the semiconductor body 20 with the aid of a sacrificial layer 41. The sacrificial layer 41 is thus arranged between the auxiliary carrier 40 and the semiconductor body 20. The auxiliary carrier 40 and the sacrificial layer 41 can be designed as described in connection with FIG. 5. In a next step of the method, the growth substrate 30 is removed from the semiconductor body 20. The growth substrate 30 can be removed from the semiconductor body 20 by methods as described in connection with FIG. 4. The top side 26 of the semiconductor body facing away from the auxiliary carrier 40 can be processed after removal of the growth substrate 30. Subsequently, n-side contacts 23 and p-side contacts 24 are applied to the semiconductor body 20, as described in connection with FIG. 2.

According to the further example of the method, the semiconductor body 20 is processed analogously to the method steps shown in FIGS. 7 to 11 or 13 to 15.

In contrast to the methods shown in FIGS. 7 to 15, however, in this further example of the method, the connection carrier 60 is located at the side of the n-doped region 21 of the semiconductor body 20 and the emission side of the semiconductor body 20 is located at the side of the p-doped region 22 of the semiconductor body 20. This means, no intermediate carrier 50 is required in this further example of the method to apply the auxiliary carrier 40 at the first side 27 of the semiconductor body 20 and apply the connection carrier 60 to the second side 28 of the semiconductor body 20.

Figure 18:
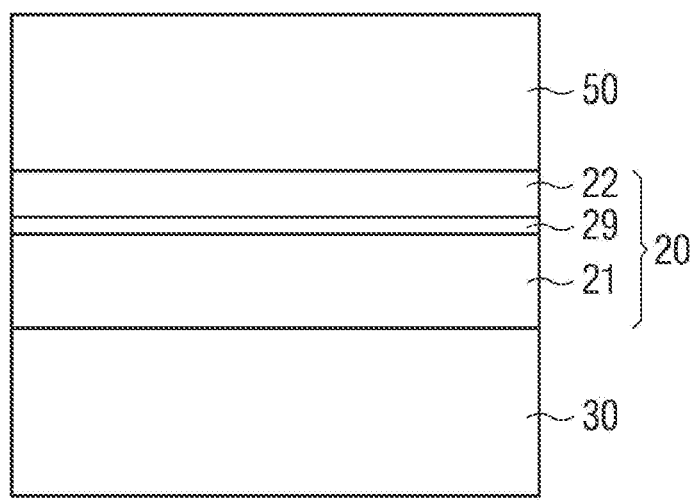
FIGS. 18 to 21 show steps of a further example of the method.

A further example of the method is described with FIGS. 18 to 21. FIG. 18 shows a method step following after the method step shown in FIG. 1. In this example, the intermediate carrier 50 is applied to the semiconductor body 20 at the side of the p-doped region 22 without the n-side contacts 23 and p-side contacts 24 being applied previously on the p-doped region 22.

Figure 19:
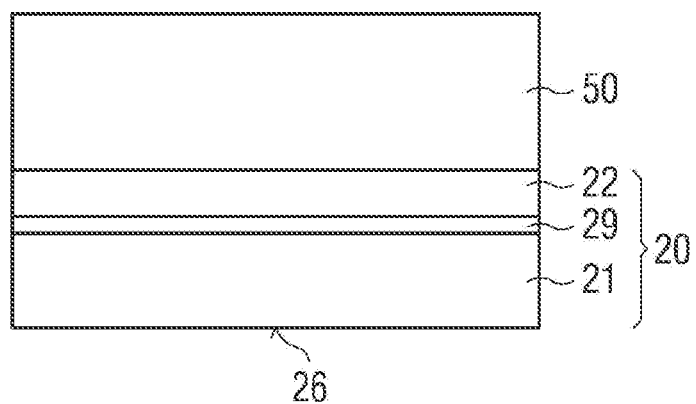

The next steps of the further example run analogously to the method steps shown in FIGS. 4, 5 and 6. FIG. 19 shows that the growth substrate 30 is removed from the semiconductor body 20. In addition, the top side 26 of the n-doped region 21 is processed. The top side 26 of the n-doped region is the side, which is located on the side of the n-doped region 21 facing away from the intermediate carrier 50. The top side 26 of the n-doped region 21 can be polished or roughened, for example, or it is possible, that a mechanical protection is applied.

Figure 20:
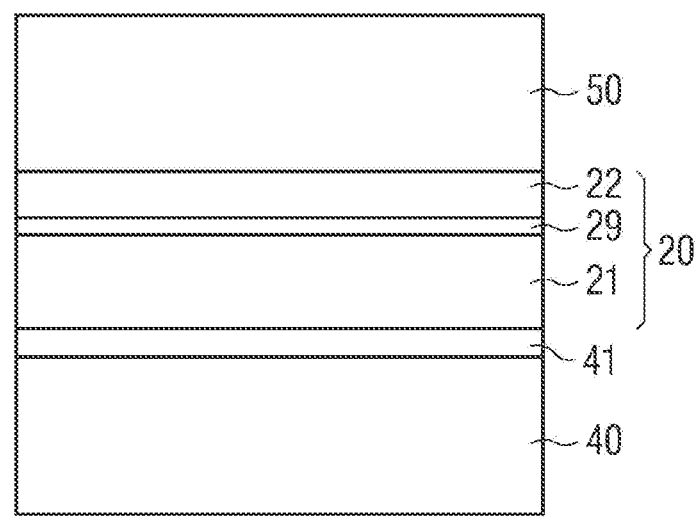

FIG. 20 shows, in that an auxiliary carrier 40 is applied to the semiconductor body 20 on the side of the n-doped region 21. As described with reference to FIG. 5, a sacrificial layer 41 is arranged between the auxiliary carrier 40 and the semiconductor body 20.

Figure 21:
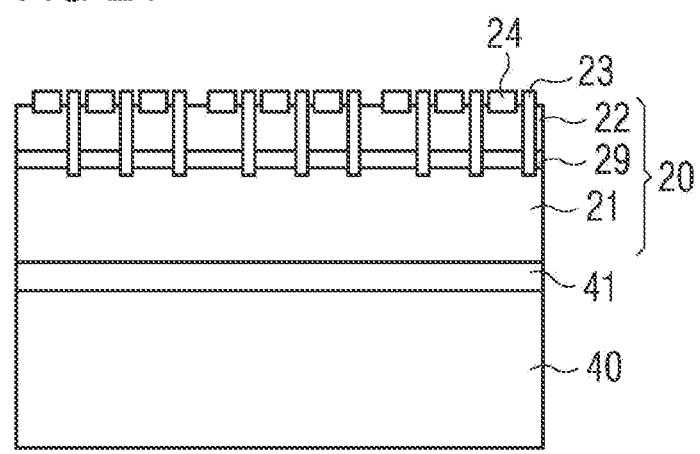

In the next step of the method as shown in FIG. 21, the intermediate carrier 50 is removed from the semiconductor body 20. Subsequently, n-side contacts 23 and p-side contact-connections 24 are arranged on the p-doped region 22, as described in FIG. 2. Advantageously, the n-side contacts 23 and the p-side contacts 24 are applied in this example after removal of the growth substrate 30 and after application of the auxiliary carrier 40. Distortion effects of the n-side contacts 23 and of the p-side contacts 24 are thus avoided, which can occur in the previous method steps. This enables a precise adjustment of the n-side contacts 23 and the p-side contacts 24 on the contact points 61 of the connection carrier 60. The following method steps are shown in FIGS. 7 to 11.

Figure 22:
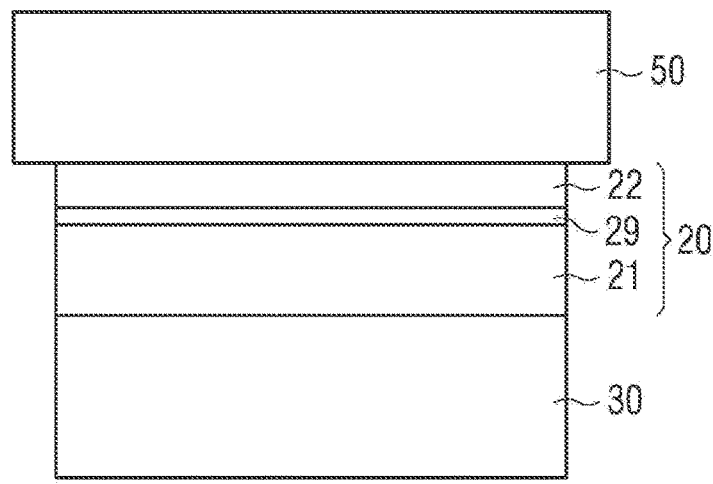
FIGS. 22 to 24 show steps of a further example of the method.
Figure 23:
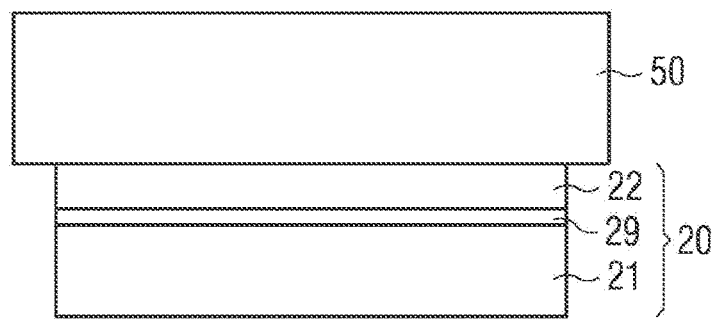
Figure 24:
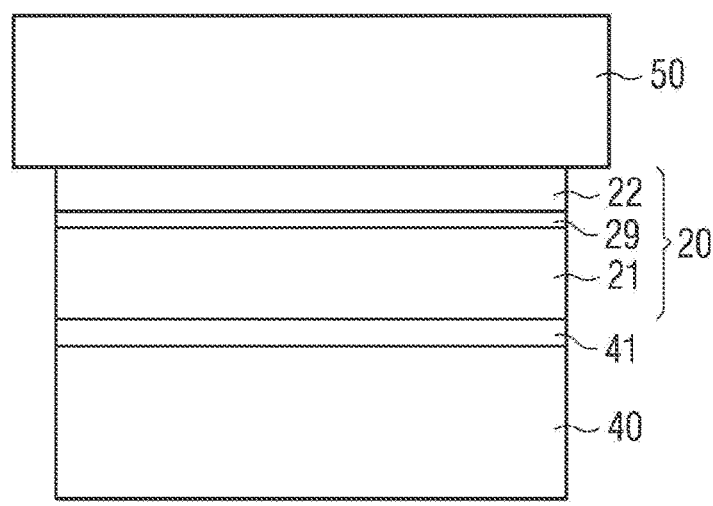

A further example of the method is described in FIGS. 22 to 24. FIG. 22 shows a method step following after the method steps shown in FIG. 1. In this example, similar as shown in FIG. 18, the intermediate carrier 50 is applied to the semiconductor body 20 at the side of the p-doped region 22, without n-side contacts 23 and p-side contacts 24 being applied on the p-doped region 22. In this example, the intermediate carrier 50 is a holding device. The semiconductor body 20 can thus be fastened to the holding device for the following two method steps. The holding device can be part of a machine used as a holding device for the semiconductor body 20.

In the next method step as shown in FIG. 23, the growth substrate 30 is removed from the semiconductor body 20.

FIG. 24 shows that an auxiliary carrier 40 is applied to the semiconductor body 20 at the side of the n-doped region 21. As described with reference to FIG. 5, a sacrificial layer 41 is arranged between the auxiliary carrier 40 and the semiconductor body 20. The intermediate carrier 50 is then removed from the semiconductor body 20. Thus, the semiconductor body 20 is no longer fastened to the holding device in the following method steps. The following method steps are described with FIGS. 21 and 7 to 11.

Our methods are not restricted to the examples by the description on the basis of the examples. Rather, this disclosure encompasses any new feature and combination of features including in particular any combination of features in the appended claims, even if the feature or combination itself is not explicitly specified in the claims or examples.

This application claims priority of DE 10 2016 124 646.8, the subject matter of which is incorporated herein by reference.

The invention claimed is:

1. A method of producing a semiconductor component, comprising:
    applying an auxiliary carrier at a first side of a semiconductor body, the auxiliary carrier having a first lateral coefficient of thermal expansion, and
    applying a connection carrier at a second side of the semiconductor body facing away from the auxiliary carrier, the connection carrier having a second lateral coefficient of thermal expansion, wherein
    the semiconductor body is grown on a growth substrate different from the auxiliary carrier,
    the first and the second lateral coefficient of thermal expansion differ by at most 50%,
    the growth substrate is completely removed prior to application of the auxiliary carrier, and
    the auxiliary carrier is removed after applying the connection carrier.

2. The method according to claim 1, wherein, between the auxiliary carrier and the semiconductor body, a sacrificial layer is arranged which is not produced epitaxially.

3. The method according to claim 2, wherein the sacrificial layer is removed from the semiconductor body after application of the connection carrier.

4. The method according to claim 3, wherein the sacrificial layer is removed from the semiconductor body by wet-chemical etching.

5. The method according to claim 1, wherein the semiconductor body is heated at least in places by at least 100 K from an initial temperature during application of the connection carrier and is subsequently cooled by at least 50 K.

6. The method according to claim 1, wherein the semiconductor body emits electromagnetic radiation during operation of the semiconductor component.

7. The method according to claim 1, wherein the semiconductor body and the auxiliary carrier are separated transversely or perpendicularly to a main direction of extension of the auxiliary carrier into a plurality of arrangements, each comprising a part of the semiconductor body and a part of the auxiliary carrier, before the connection carrier is applied to the semiconductor body.

8. The method according to claim 1, wherein the growth substrate is not formed with silicon.

9. The method according to claim 1, wherein the semiconductor body comprises an n-doped region and a p-doped region, and the connection carrier is applied to the semiconductor body at the side of the p-doped region.

10. The method according to claim 1, wherein the connection carrier comprises an integrated circuit.

11. The method according to claim 1, wherein the connection carrier comprises a plurality of contact points at its side facing the semiconductor body, and the contact points mechanically and electrically conductively connect to the semiconductor body.

12. The method according to claim 1, wherein, prior to application of the auxiliary carrier, an intermediate carrier is applied to the second side of the semiconductor body.

13. The method according to claim 1, wherein the semiconductor body is polished on the first side of the semiconductor body before application of the auxiliary carrier, and electrical contacts are applied at the second side of the semiconductor body prior to application of the connection carrier.

14. The method according to claim 1, wherein the auxiliary carrier and the connection carrier consist of at least 80 percent by weight of the same basic material.

15. The method according to claim 1, wherein the growth substrate is arranged at the second side of the semiconductor body during growth of the semiconductor body.

16. The method according to claim 1, wherein the connection carrier comprises control electronics on or in a silicon substrate.

17. A method of producing a semiconductor component, comprising:
    applying an auxiliary carrier at a first side of a semiconductor body, the auxiliary carrier having a first lateral coefficient of thermal expansion, and
    applying a connection carrier at a second side of the semiconductor body facing away from the auxiliary carrier, the connection carrier having a second lateral coefficient of thermal expansion, wherein
    the semiconductor body is grown on a growth substrate different from the auxiliary carrier,
    the second side of the semiconductor body faces away from the growth substrate,
    the first and the second lateral coefficient of thermal expansion differ by at most 50%, and
    prior to application of the auxiliary carrier, an intermediate carrier is applied to the second side of the semiconductor body.

18. The method according to claim 17, wherein the connection carrier comprises control electronics on or in a silicon substrate.

* * * * *